United States Patent
Kim et al.

(10) Patent No.: US 6,997,670 B2
(45) Date of Patent: Feb. 14, 2006

(54) SEMICONDUCTOR WAFER TRANSFER APPARATUS

(75) Inventors: Kwang-il Kim, Suwon (KR); Sung-yun Kang, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 152 days.

(21) Appl. No.: 10/628,244

(22) Filed: Jul. 29, 2003

(65) Prior Publication Data

US 2004/0076506 A1  Apr. 22, 2004

(30) Foreign Application Priority Data

Oct. 22, 2002 (KR) ............... 10-2002-0064648

(51) Int. Cl.
*B65G 45/00* (2006.01)
(52) U.S. Cl. .................. 414/749.1; 198/495
(58) Field of Classification Search ............ 414/749.1, 414/751.1; 198/468.4, 468.9, 750.1, 750.12, 198/494, 495

See application file for complete search history.

(56) References Cited

U.S. PATENT DOCUMENTS 4,319,864 A * 3/1982 Kaufeldt .................. 414/751.1
6,038,788 A   3/2000 Chang
6,766,895 B1 * 7/2004 Matsumura ................. 198/495

FOREIGN PATENT DOCUMENTS

| JP | 3-21464 | 1/1991 |
|---|---|---|
| JP | 6-61328 | 3/1994 |
| JP | 7-29961 | 1/1995 |
| KR | 1997-0001884 | 12/1997 |
| KR | 20-0131997 | 9/1998 |
| KR | 0163545 | 9/1998 |
| KR | 1999-028079 | 4/1999 |
| KR | 20-0163916 | 10/1999 |
| KR | 2000-0030950 | 6/2000 |
| KR | 20-0234725 | 6/2001 |
| KR | 2001-0081843 | 8/2001 |
| KR | 20-0247698 | 9/2001 |

* cited by examiner

*Primary Examiner*—Donald W. Underwood
(74) *Attorney, Agent, or Firm*—Staas & Halsey LLP

(57) ABSTRACT

A semiconductor wafer transfer apparatus includes a wafer supporting block to support a semiconductor wafer, a casing which is formed along a moving path of the wafer supporting block and having a guiding slot through which a part of the wafer supporting block passes, a driving part which is accommodated in the casing and moves the wafer supporting block, a connection part which connects the driving part with the wafer supporting block, and a shield part which shields the driving part from the guide slot. Accordingly, dust and particles generated inside the casing is effectively prevented from leaking out through the guide slot.

15 Claims, 5 Drawing Sheets

SEMICONDUCTOR WAFER TRANSFER APPARATUS

CROSS-REFERENCE TO RELATED APPLICATIONS

This application claims the benefit of Korean Patent Application No. 2002-64648, filed Oct. 22, 2002, in the Korean Intellectual Property Office, the disclosure of which is incorporated herein by reference.

BACKGROUND OF THE INVENTION

1. Field of the Invention

The present invention relates to a semiconductor wafer transfer apparatus, and more particularly, to a semiconductor wafer transfer apparatus having a wafer supporting block which supports a semiconductor wafer.

2. Description of the Related Art

Generally, a semiconductor wafer is processed into a semiconductor device through various operations, and a transfer apparatus is needed to transfer the semiconductor wafer from one process operation to another process operation.

During these process operations, it is desirable to prevent the semiconductor wafer from being contaminated by dust and particles.

FIGS. 1 and 2 show a conventional semiconductor wafer transfer apparatus 101 which includes a wafer supporting block 120 that supports a semiconductor wafer (not shown), and a casing 110 that is formed along a moving path of the wafer supporting block 120. A guiding slot 113 is provided to the casing 110 so as to allow a part of the wafer supporting block 120 to pass therethrough. The semiconductor wafer transfer apparatus 101 further includes a driving part 130 which is accommodated in the casing 110 and moves the wafer supporting block 120, a connection part 140 which connects the driving part 130 with the wafer supporting block 120, and a guide unit 150 which is combined to both the wafer supporting block 120 and the connection part 140 inside the casing 110, and guides the wafer supporting block 120.

The wafer supporting block 120 includes a wafer supporter 123 which is provided outside the casing 110 and mounted with a hand (not shown) which holds the semiconductor wafer, and a combination part 125 which is extended from the wafer supporter 123 and combined to both the connection part 140 and the guide unit 150 with screws 159 that pass through the guiding slot 113.

The casing 110 surrounds the driving part 130, the guide unit 150 and the connection part 140, and partitions them off from a wafer transfer chamber (not shown), a wafer reaction chamber (not shown), etc., so as to prevent the semiconductor wafer from being contaminated by dust and particles generated from, for example, the driving part 130. The combination part 125 of the wafer supporting block 120, which is driven by the driving part 130, passes and is guided along the guiding slot 113. The casing 110 further includes a casing cover 115.

The driving part 130 includes a belt 133 which is connected to the connection part 140 and moves together with the connection part 140, a plurality of pulleys 135 which engage with the belt 133, and a driving motor 137 which drives a corresponding one of the pulleys 135. The driving part 130 is supported by a driving part supporter 139, which is attached to a floor of the casing 110.

The belt 133 is fastened to a belt connection part 143 of the connection part 140 with bolts 148 and nuts 149, and moves the wafer supporting block 120 connected to the other part of the connection part 140 where the driving motor 137 is operated.

The pulleys 135 are placed at opposite ends of the belt 133, and are used to transmit a rotary motion from the driving motor 137 to the belt 133.

The connection part 140 includes the belt combining part 143 which is combined to the belt 133 with the bolts 148 and nuts 149, and a guide combining part 145 which is combined to the combination part 125 of the wafer supporting block 120 and the guide unit 150 with the screws 159.

The guide unit 150 is provided inside the casing 110, and includes a guide member 153 which is combined to the combination part 125 of the wafer supporting block 120 and the guide combining part 145 of the connection part 140, and a guide rail 155 which is attached to the floor of the casing 110 and guides the guide member 153.

The guide member 153 has a rectangular block shape and is guided by the guide rail 155. The guide rail 155 has an "U"-shape which accommodates the guide member 153, and is arranged along a moving path of the guide member 153.

The conventional semiconductor wafer transfer apparatus 101 is operated as follows.

Where the driving motor 137 rotates the pulley 135, the belt 133 runs on the pulleys 135 so as to move the connection part 140. Accordingly, the wafer supporting block 120, which is combined with the connection part 140, is guided by the guide unit 150 and moves to transfer the semiconductor wafer. Where the driving motor 137 reverses the rotation of the pulley 135, the wafer supporting block 120 is returned to an original position. That is, as the driving motor 137 alternates the rotating directions, the wafer supporting block 120 reciprocates within a predetermined distance, thereby repeatedly transferring the semiconductor wafer.

However, in the conventional semiconductor wafer transfer apparatus 101, the semiconductor wafer can be contaminated by dust and particles which are generated from an operation of the driving part 130 and introduced to the semiconductor wafer through the guide slot 113.

SUMMARY OF THE INVENTION

Accordingly, it is an aspect of the present invention to provide a semiconductor wafer transfer apparatus, in which dust and particles generated inside a casing are effectively prevented from leaking out.

Additional aspects and advantages of the invention will be set forth in part in the description which follows and, in part, will be obvious form the description, or may be learned by practice of the invention.

To achieve the above and/or other aspects of the present invention, there is provided a semiconductor wafer transfer apparatus comprising a wafer supporting block to support a semiconductor wafer, a casing formed along a moving path of the wafer supporting block and having a guiding slot through which a part of the wafer supporting block passes, a driving part which is accommodated in the casing and moves the wafer supporting block, a connection part which connects the driving part with the wafer supporting block, and a shield part which shields the driving part from the guide slot.

The semiconductor wafer transfer apparatus may further comprise a guide unit which includes a guide member provided inside the casing and having a first end combined to the connection part and a second end combined to the wafer supporting block, and a guide rail which is attached to a floor of the casing and guides the guide member. The shield part may be provided between the guide unit and the driving part. The shield part may have a plate like shape.

The semiconductor wafer transfer apparatus may further comprise a first auxiliary shield part which is provided inside the casing and shields the connection part from the guide slot.

The semiconductor wafer transfer apparatus may further comprise a second auxiliary shield part which is provided in a lower part of the guide slot and shields the guide unit from the guide slot.

The driving part may include a belt which is connected to the connection part and moves the connection part, pulleys which engage with the belt, and a driving motor which drives at least one of the pulleys. The belt may be a timing belt, and the pulleys may be provided so as to engage with the timing belt.

BRIEF DESCRIPTION OF THE DRAWINGS

These and/or other aspects and advantages of the present invention will become apparent and more readily appreciated from the following description of the embodiments, taken in conjunction with the accompany drawings of which.

DETAILED DESCRIPTION OF THE PREFERRED EMBODIMENTS

Figure 1:
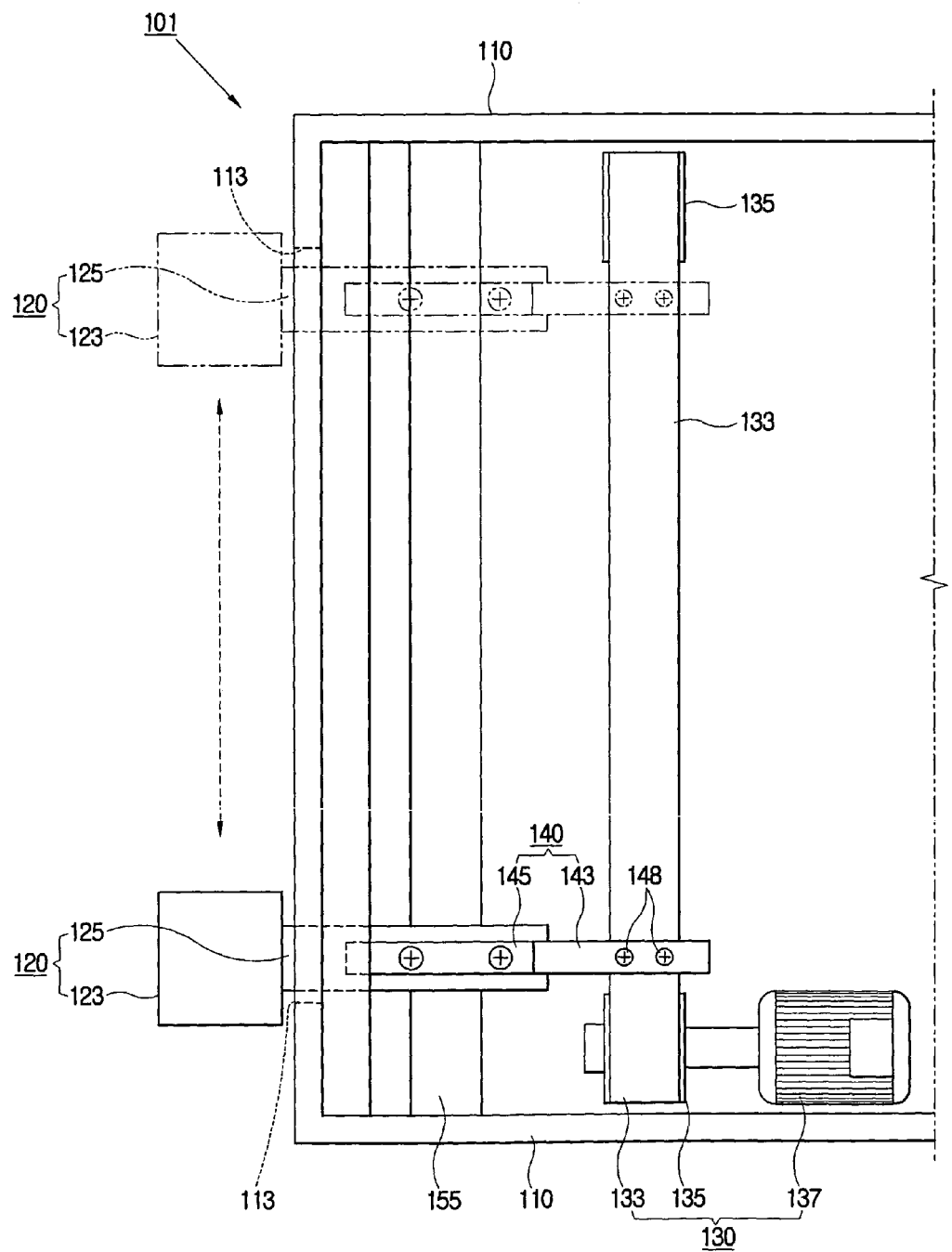
FIG. 1 is a partial plan view of a conventional semiconductor wafer transfer apparatus, with its casing over being taken off.
Figure 2:
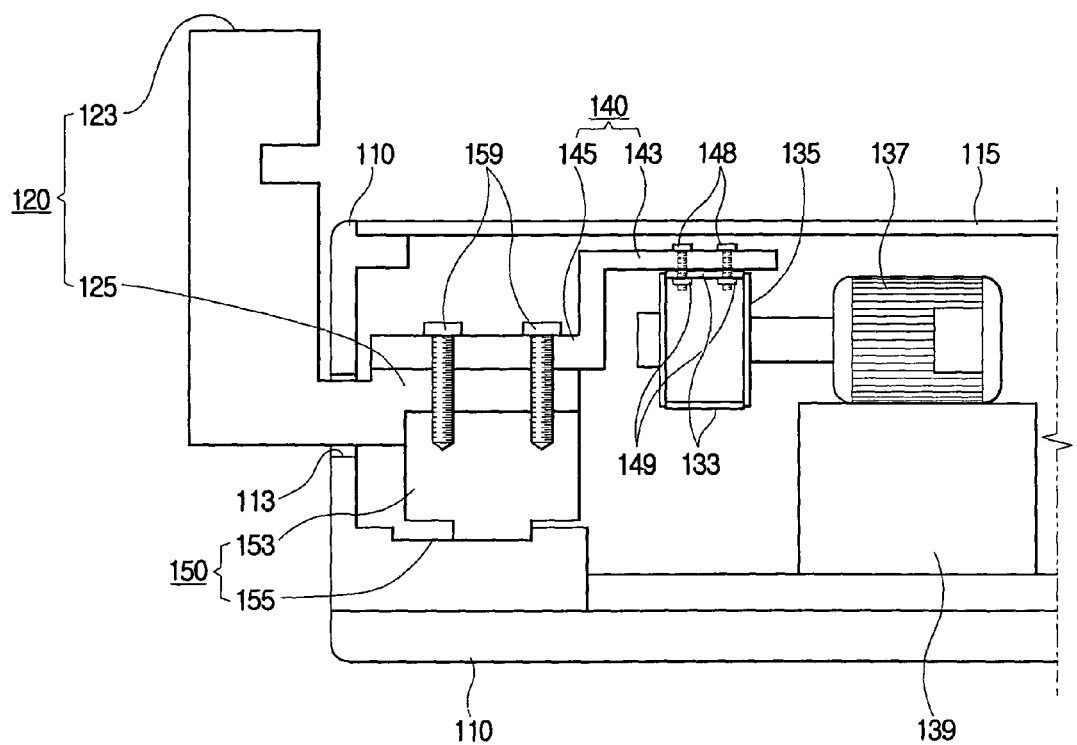
FIG. 2 is a cross-sectional view of the conventional semiconductor wafer transfer apparatus shown in FIG. 1 with the casing cover.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 3:
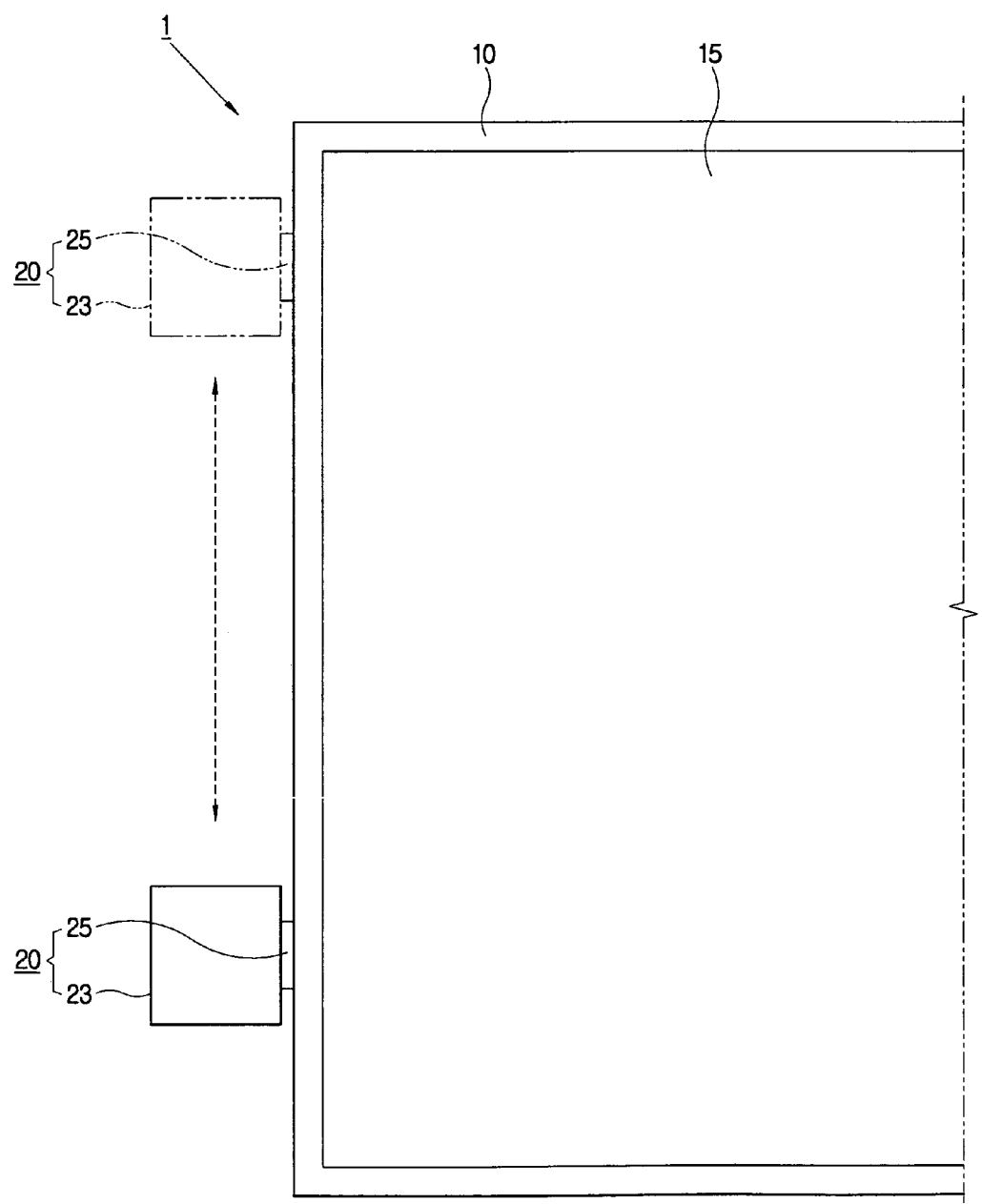
FIG. 3 is a partial plan view of a semiconductor wafer transfer apparatus according to an embodiment of the present invention.
Figure 4:
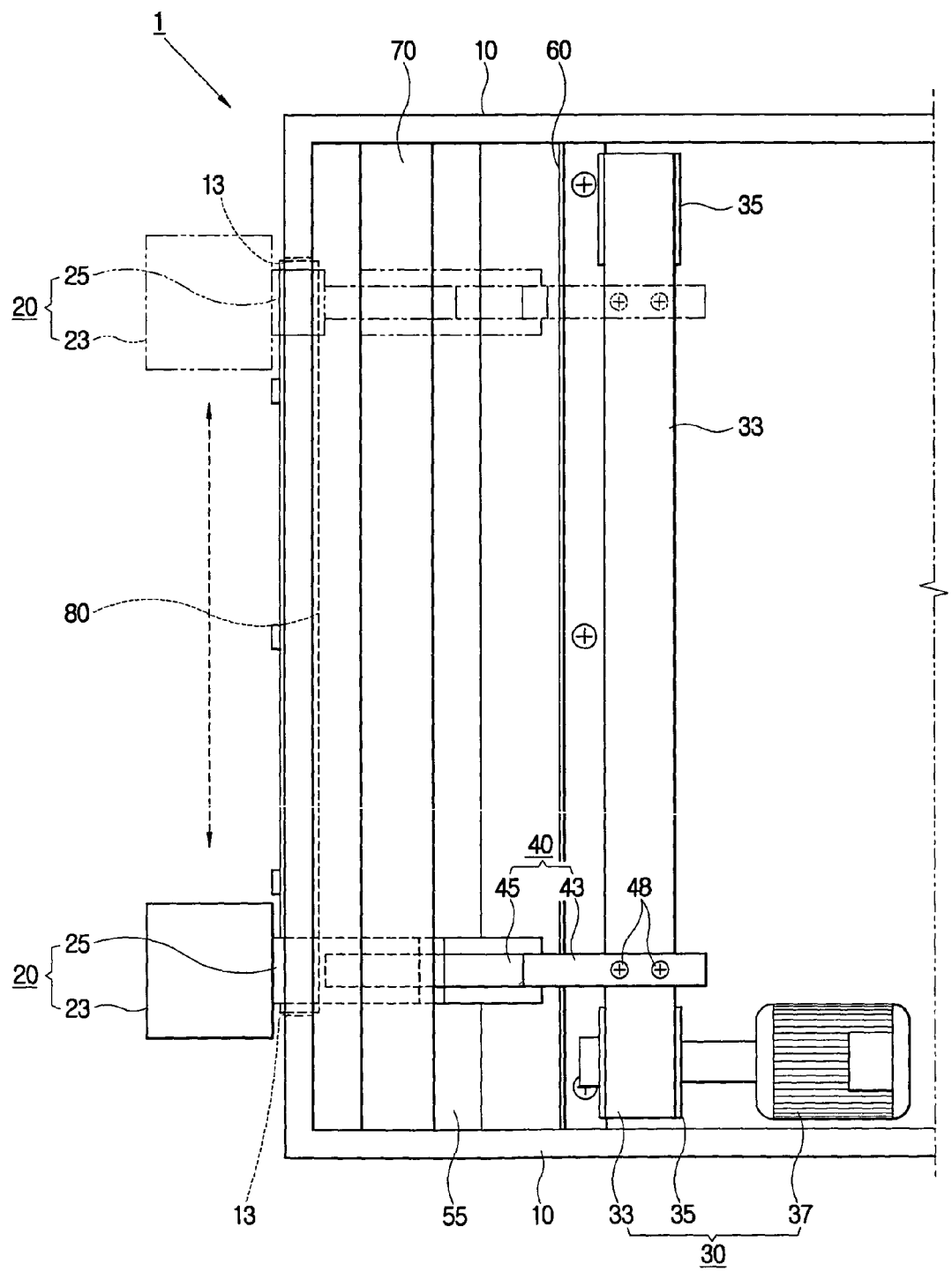
FIG. 4 is a partial plan view of the semiconductor wafer transfer apparatus of FIG. 3, with its casing cover being taken off.
Figure 5:
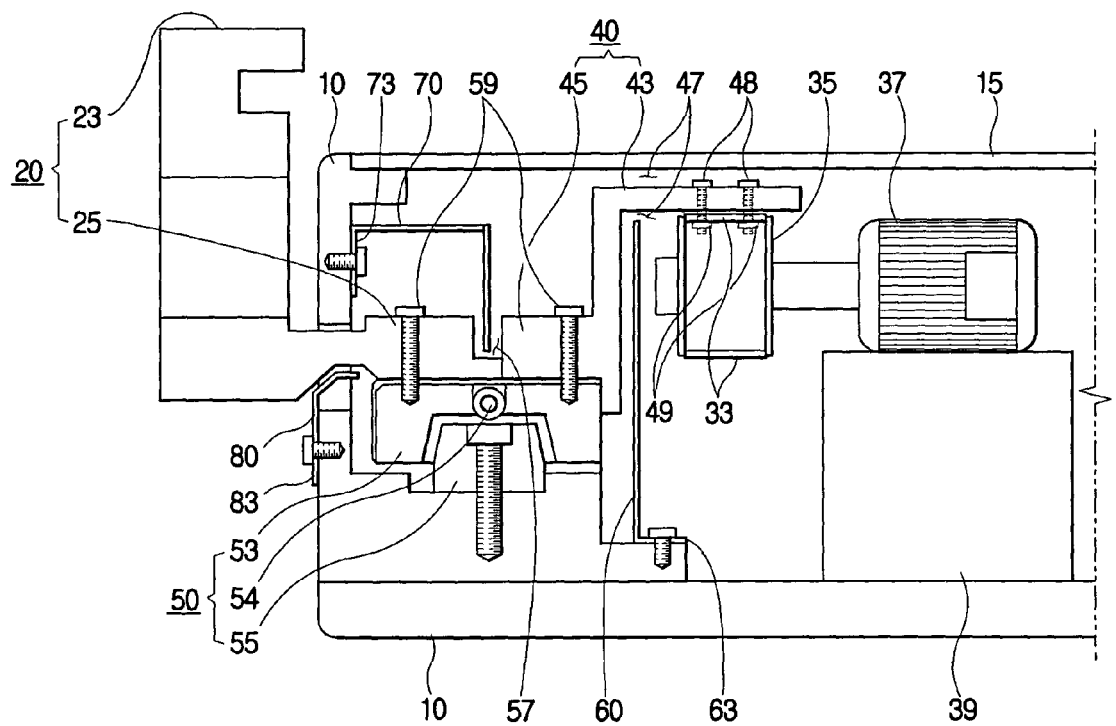
FIG. 5 is a cross-sectional view of the semiconductor wafer transfer apparatus of FIG. 3.

FIGS. 3 through 5 show a semiconductor wafer transfer apparatus 1 according to an embodiment of the present invention. The semiconductor wafer transfer apparatus 1 comprises a wafer supporting block 20 which supports a semiconductor wafer (not shown), a casing 10 formed along a moving path of the wafer supporting block 20 and having a guide slot 13 through which a part of the wafer supporting block 20 passes, a driving part 30 which is accommodated in the casing 10 and moves the wafer supporting block 20, a connection part 40 which connects the driving part 30 with the wafer supporting block 20, and a guide unit 50 which is combined to both the wafer supporting block 20 and the connection part 40 inside the casing 10, and guides the wafer supporting block 20. The semiconductor wafer transfer apparatus 1 further comprises a shield part 60 which shields the driving part 30 from the guide slot 13. For example, the shield part 60 shields the driving part 30 but for an area corresponding to, for example, a cross-sectional area of the connection part 40.

The wafer supporting block 20 includes a wafer supporter 23 which is provided outside the casing 110 and mounted with a hand (not shown) which holds the semiconductor wafer, and a combination part 25 which is extended from the wafer supporter 23 and combined to the guide unit 50 with screws 59 by passing through the guide slot 13.

The casing 10 surrounds the driving part 30, the guide unit 50 and the connection part 40, and partitions them off from, for example, a wafer transfer chamber (not shown) and a wafer reaction chamber (not shown), so as to prevent the semiconductor wafer from being contaminated by dust and particles generated from the driving part 30 and the like components in the casing 10. The guide slot 13 of the casing 10 allows the combination part 25 of the wafer supporting block 20 to pass therethrough and be guided where the wafer supporting block 20 is driven by the driving part 30. The casing 10 further includes a casing cover 15 which covers a portion of the casing 10.

The driving part 30 includes a belt 33 which is connected to the connection part 40 and moves together with the connection part 40, a plurality of pulleys 35 which engage with the belt 33, and a driving motor 37 which drives a corresponding one of the pulleys 35. The driving part 30 is supported by a driving part supporter 39 that is attached to a floor of the casing 10.

The belt 33 is, for example, a timing belt having internal teeth so as to move a precise distance in response to an operation of the driving motor 37, and is fastened to a belt connection part 43 of the connection part 40 with, for example, bolts 48 and nuts 49, so as to move the wafer supporting block 20 where the driving motor 37 is operated.

The pulleys 35 may have grooves on a periphery thereof which fit with the internal teeth of the belt 33 so as to transmit a rotary motion from the driving motor 37 to the belt 33.

The connection part 40 includes the belt connecting part 43 which is combined to the belt 33 with the bolts 48 and the nuts 49, and a guide combining part 45 which is combined to the guide unit 50 with, for example, screws 59.

The guide unit 50 is provided inside the casing 10, and includes a guide member 53 having an upper part combined to both the guide combination part 45 of the connection part 40 and the combination part 25 of the wafer supporting block 20, and a guide rail 55 which is attached to the floor of the casing 10 and guides the guide member 53.

The guide member 53 is formed with a lower part having a "∩"-shape, and is guided by the guide rail 55 having an elongated rectangular solid shape. One or more ball bearings 54 are provided to the lower part of the guide member 53 so as to contact with the guide rail 55. The one or more ball bearings 54 allow the guide member 53 to smoothly slide on the guide rail 55. The guide combination part 45 of the connection part 40 and the combination part 25 of the wafer supporting block 20 are combined to the upper part of the guide member 53 with the screws 59. A groove 57 is provided between the guide combination part 45 of the connection part 40 and the combination part 25 of the wafer supporting block 20, so as to accommodate an end of a first auxiliary shield part 70 (to be described later).

The guide rail 55 has an upper part having an elongated rectangular solid shape which corresponds to the lower part of the guide member 53, and a lower part which is attached to the floor of the casing 10 and arranged along a moving path of the guide member 53

The shield part 60 is, for example, an elongated plate which shields the driving part 30 from the guide unit 50 so as to prevent particles generated in the driving part 30 from leaking out through the guide slot 13. A lower part of the shield part 60 forms a bracket 63 which is attached to the floor of the casing 10. A passage 47 is formed between an upper part of the shield part 60 and the casing cover 15 for the connection part 40. The shield part 60 prevents dust and particles generated in the driving part 30 from leaking out to the guide unit 50 and the guide slot 13.

The semiconductor wafer transfer apparatus 1 according to the present invention further comprises the first auxiliary shield part 70 which is provided inside the casing 10 and shields the connection part 40 from the guide slot 13, and a second auxiliary shield part 80 which is provided in the guide slot 13 under the combination part 25 of the wafer supporting block 20 and shields the guide unit 50 from the guide slot 13.

The first auxiliary shield part 70 is, for example, an elongated plate having a "T"-shaped cross section, and is fastened to the casing 10 over the guide slot 13 (see FIG. 5). A first end of the first auxiliary shield part 70 has a bracket 73 which is attached to the casing 10, and a second end of the first auxiliary shield part 70 is accommodated in the groove 57 between the guide combination part 45 of the connection part 40 and the combination part 25 of the wafer supporting block 20, which are combined onto the upper part of the guide member 53. The first auxiliary shield part 70 prevents particles generated in the connection part 40, as well as the particles generated in the driving part 30 that have passed through the passage 47, from leaking out to the guide slot 13.

The second auxiliary shield part 80 is, for example, an elongated plate provided along a lower part of the guide slot 13 (see FIG. 5). A lower part of the second auxiliary shield part 80 has a bracket 83 which is attached to the casing 10 below the guide slot 13. An upper part of the second auxiliary shield part 80 is inwardly curved so as to correspond to the shape of a lower part of the combination part 25 of the wafer supporting block 20. The second auxiliary shield part 80 prevents particles generated in the guide unit 50, as well as the particles generated in the driving part 30 that have passed through the passage 47, from leaking out to the guide slot 13.

The semiconductor wafer transfer apparatus 1 of the present invention is operated as follows.

Where the driving motor 37 rotates the pulley 35, the belt 33 runs on the pulleys 35 so as to move the connection part 40. Accordingly, the wafer supporting block 20, which is combined with the connection part 40, is guided by the guide unit 50 and moves to transfer the semiconductor wafer. Where, the driving motor 37 reverses the rotation of the pulley 35, the wafer supporting block 20 is returned to an original position. That is, as the driving motor 37 alternates the rotating directions, the wafer supporting block 20 reciprocates within a predetermined distance, thereby repeatedly transferring the semiconductor wafer.

During the operation of the semiconductor wafer transfer apparatus 1, the shield part 60, which is provided between the driving part 30 and the guide unit 50, prevents the particles generated in the driving part 30 from leaking out to the guide unit 50 and the guide slot 13. Additionally, the first auxiliary shield part 70, which is attached to the casing 10 over the guide slot 13, prevents the particles generated in the connection part 40, as well as the particles generated in the driving part 30 that have passed through the passage 47, from leaking out to the guide slot 13. Furthermore, the second auxiliary shield part 80, which is attached to the casing 10 under the guide slot 13, prevents the particles generated in the guide unit 50, as well as the particles generated in the driving part 30 that have passed through the passage 47, from leaking out to the guide slot 13.

As described above, the present semiconductor wafer transfer apparatus effectively prevents dust and particles generated inside the casing from leaking out of the casing through the guide slot.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A semiconductor wafer transfer apparatus comprising:
   a wafer supporting block to support a semiconductor wafer;
   a casing formed along a moving path of the wafer supporting block and having a guide slot through which a part of the wafer supporting block passes;
   a driving part which is accommodated in the casing and moves the wafer supporting block;
   a connection part which connects the driving part with the wafer supporting block;
   a shield part which shields the driving part from the guide slot; and
   a first auxiliary shield part which is provided inside the casing and shields the connection part from the guide slot.

2. The semiconductor wafer transfer apparatus according to claim 1, further comprising a guide unit which includes:
   a guide member provided inside the casing and having a first end combined to the connection part and a second end combined to the wafer supporting block; and
   a guide rail which is attached to a floor of the casing and guides the guide member, wherein the shield part is provided between the guide unit and the driving part.

3. The semiconductor wafer transfer apparatus according to claim 2, further comprising a second auxiliary shield part which is provided in a lower part of the guide slot and shields the guide unit from the guide slot.

4. The semiconductor wafer transfer apparatus according to claim 1, wherein the driving part includes:
   a belt which is connected to the connection part and moves the connection part;
   pulleys which engage with the belt; and
   a driving motor which drives at least one of the pulleys.

5. The semiconductor wafer transfer apparatus according to claim 4, wherein:
   the belt is a timing belt, and
   the pulleys engage with the timing belt.

6. The semiconductor wafer transfer apparatus according to claim 1, wherein the shield part has a plate like shape.

7. The semiconductor wafer transfer apparatus according to claim 1, wherein the shield part shields the driving part so as to prevent dust and particles from leaking out through the guide slot.

8. The semiconductor wafer transfer apparatus according to claim 2, wherein the guide unit further includes one or more ball bearings which are provided between the guide member and the guide rail.

9. The semiconductor wafer transfer apparatus according to claim 3, wherein:
   the shield part primarily prevents dust and particles from leaking out through the guide slot,
   the first auxiliary shield part secondarily prevents the dust and particles from leaking out through the guide slot, and the second auxiliary shield part further prevents the dust and particles that have passed through the first auxiliary shield part from leaking out through the guide slot.

10. A semiconductor wafer transfer apparatus comprising:
- a wafer supporting block to support a semiconductor wafer;
- a casing formed along a moving path of the wafer supporting block and having a guide slot through which a part of the wafer supporting block passes;
- a driving part which is accommodated in the casing and moves the wafer supporting block;
- a connection part which connects the driving part with the wafer supporting block; and
- a shield part which partitions the casing so as to limit communication between the driving part and the guide slot, wherein the shield part includes a first shield part, a second shield part, and a third shield part, and wherein the second shield part is provided between the connection part and the guide slot.

11. The semiconductor wafer transfer apparatus according to claim 10, wherein the shield part shields the driving part so as to prevent dust and particles from leaking out through the guide slot.

12. The semiconductor wafer transfer apparatus according to claim 10, further comprising a guide unit which includes:
- a guide member provided inside the casing and having a first end combined to the connection part and a second end combined to the wafer supporting block; and
- a guide rail which is attached to a floor of the casing of the casing and guides the guide member.

13. The semiconductor wafer transfer apparatus according to claim 12, wherein:
- the first shield part is provided between the guide unit and the driving part; and
- the third shield part is provided between the guide unit and the guide slot.

14. The semiconductor wafer transfer apparatus according to claim 12, wherein the guide unit further includes one or more ball bearings which are provided between the guide member and the guide rail.

15. The semiconductor wafer transfer apparatus according to claim 10, wherein the shield part prevents an outflow of dust and particles from the casing to the outside of the casing.

* * * * *